(12) United States Patent
Libertino et al.

(10) Patent No.: US 7,781,764 B2
(45) Date of Patent: Aug. 24, 2010

(54) NANOMETRIC DEVICE FOR THE MEASUREMENT OF THE CONDUCTIVITY AND QUANTUM EFFECTS OF INDIVIDUAL MOLECULES AND METHODS FOR THE MANUFACTURE AND USE THEREOF

(75) Inventors: Sebania Libertino, Catania (IT); Rosaria Anna Puglisi, Tremestieri Etneo (IT); Manuela Fichera, Valverde (IT); Salvatore Antonino Lombardo, Catania (IT); Rosario Corrado Spinella, Catania (IT)

(73) Assignee: Consiglio Nazionale delle Ricerche (IT)

( * ) Notice: Subject to any disclaimer, the term of this patent is extended or adjusted under 35 U.S.C. 154(b) by 715 days.

(21) Appl. No.: 11/624,339

(22) Filed: Jan. 18, 2007

(65) Prior Publication Data
US 2007/0181870 A1    Aug. 9, 2007

(30) Foreign Application Priority Data
Jan. 18, 2006   (EP) .................................. 06000987

(51) Int. Cl.
*G01N 27/04* (2006.01)
(52) U.S. Cl. .............................. 257/48; 257/40; 257/41; 257/E51.023; 977/773; 977/791; 977/810; 977/932
(58) Field of Classification Search .................. 257/40, 257/41, 48, E51.023; 977/932, 773, 791, 977/810
See application file for complete search history.

(56) References Cited
U.S. PATENT DOCUMENTS
6,756,605 B1 * 6/2004 Reed et al. ..................... 257/40
6,870,235 B2 3/2005 Abstreiter et al.
6,888,665 B2 * 5/2005 Feldheim et al. ............ 359/328
7,642,541 B2 * 1/2010 Matsui et al. ................... 257/9
2003/0185985 A1 10/2003 Bronikowski et al.
2004/0144726 A1 7/2004 Chmelka et al.

FOREIGN PATENT DOCUMENTS
JP       2003129288       5/2003

OTHER PUBLICATIONS

Lindsay, S.M., "Single Molecule Electronics," The Electrochemical Society Interface, 13:1, 26-30 (2004).
Ishida, et al., "Electrical Conduction of Conjugated Molecular SAMs Studied by Conductive Atomic Force Microscopy," J. Phys. Chem. B, 106:23, 5886-5892 (2002).
Fink, H-W, "Electrical conduction through DNA molecules," Nature, 398: 407-410 (1999).

(Continued)

*Primary Examiner*—Anh Phung
*Assistant Examiner*—Michael Lulis
(74) *Attorney, Agent, or Firm*—Akerman Senterfitt

(57) ABSTRACT

A nanometric device is disclosed for the measurement of the electrical conductivity of individual molecules and their quantum effects having: a substrate surmounted by, in order, a barrier to diffusion layer, an electrically conductive layer, a "bounder" layer and an electrically insulating layer; and a suitable miniaturized probe; wherein the "bounder" layer and the electrically insulating layer have at least one nanometric pore formed within, the base of which consists of the electrically conductive layer. A method for the production of a nanometric device for the measurement of the electrical conductivity of individual molecules and their quantum effects, and a method for the measurement of the electrical conductivity and quantum effects of a molecule of interest, are also disclosed.

17 Claims, 6 Drawing Sheets

OTHER PUBLICATIONS

Dadosh, et al., "Measurement of the conductance of single conjugated molecules," Nature, 436:7051, 677-79 (2005).

Xiao, et al., "Measurement of Single Molecule Conductance: Benzenedithiol and Benzenedimethanethiol," Nano Letters, 4:2, 267-271 (2004).

Storm, A. J., "Single molecule expereiments on DNA with novel silicon nanostructures," Doctoral Thesis, ISBN 90-407-2485-7, 1-125 (2004).

* cited by examiner

NANOMETRIC DEVICE FOR THE MEASUREMENT OF THE CONDUCTIVITY AND QUANTUM EFFECTS OF INDIVIDUAL MOLECULES AND METHODS FOR THE MANUFACTURE AND USE THEREOF

FIELD OF THE INVENTION

The present invention generally relates to the measurement of the conductivity of individual molecules and more particularly, complex molecules, such as organic molecules or DNA strands, and a nanometric device for the measurement of their quantum effects.

This application claims priority to European Patent application No. 06000987.5 filed on Jan. 18, 2006.

BACKGROUND OF THE INVENTION

The growing trend towards the progressive shrinking in size of microelectronic devices is forcing the scientific community to find new approaches to the manufacturing of increasingly smaller miniaturized devices.

One such approach is given by molecular electronics, which exploits the characteristic spontaneous arrangement of molecules in space for the construction of electronic devices. In particular complex molecules may be used as active devices by exploiting the self-assembling properties of such molecules to produce electronic devices on a nanometer scale.

Such an approach heavily relies on the full understanding of the electronic properties and behavior of the single molecules one intends to use.

Much experimental and theoretical work has been carried out in this field but, to date, no device has been obtained which can successfully measure or predict the electric behavior of a single molecule and thus evaluate its conduction.

Existing devices include the one described in patent application FR 2847983 (Centre National de la Recherche Scientifique): a miniature device for electrical detection of ligand-receptor interactions which comprises an electrically insulating solid support having a flat surface and carrying a matrix of nano-electrodes arranged in pairs. The inter-electrode space is covered with an organic hydrophilic layer for the fixation of polypeptide probes. The device is connected to a system which measures the electrical conductivity between each pair of nano-electrodes.

U.S. Pat. No. 6,870,235 (Abstreiter et al.) describes a nanometric semiconductor sensor device for the detection of target molecules and molecular interactions based on silicon on insulator (SOI) technology. The semiconductor biosensor comprises a field effect transistor (FET) into which an SOI is converted by means of a silicon conversion technology based on a lithography method. Such device enables the selective recognition or detection of biomolecules on the basis of their electrical responses.

The most significant hurdle that is encountered in the measurement of the conductivity of single molecules is their isolation. Another obstacle is given by the natural tendency of free-standing molecules to polymerize and bond with each other. Multiple free-standing molecules also have a tendency to bend, with the consequent alteration of their conduction properties.

The need therefore arises for an alternative approach to the conventional methods for the isolation and measurement of the electrical conductivity of individually free-standing molecules.

To this purpose, an appealing alternative to conventional photolithographic methods is given by diblock copolymers, which provides a low-cost and reliable way of patterning at nanometer-scale. The formation of nano-masks through the use of diblock copolymers relies on the spontaneous arrangement of these molecules to form a dense lattice of hexagonally arranged cylindrical pores across the depth of a thin film and over wafer-scale areas.

Self-assembled diblock copolymer thin films may also be used as sacrificial layers for the transfer of such dense nanoscale patterns into robust and thermally stable materials such as $SiO_2$ layers. Other applications include the formation of pillars rather than holes by reversing the tone of the polymer template, which is obtained by selecting the complementary block molecular weight ratio.

To this respect, application JP2003129288 (Canon KK) describes a process for manufacturing a porous structure of regularly arranged pores wherein: a block copolymer layer is formed on the material to be processed; the block copolymer layer is thermally annealed to form sea and island structures; the island structures are removed from the block copolymer layer after the sea and island structures have been subjected to either anodic oxidation or anodic formation to form a nanoporous structure reflecting the structure of the block copolymer layer.

Patent application US2004144726 (Chmelka et al.) also describes a mesoscopically ordered, hydrothermally stable metal oxide-block copolymer composite or mesoporous material formed using amphiphilic block copolymers acting as structure directing agents for the metal oxide in a self-assembling system.

Patent application US2003185985 (Bronikowski and Hunt) describes a method of forming a periodic array of nano-scale objects using a block copolymer. The method includes the steps of: depositing a block copolymer of at least two blocks on a substrate to form an ordered meso-scale structured array of the polymer materials; forming catalytic metal dots based on the meso-scale structure; and growing nano-scale objects on the catalytic dots to form an ordered array of nano-scale objects.

The doctoral thesis by Storm, A. J. "Single molecule experiments on DNA with novel silicon nanostructures" (ISBN 90-407-2485-7) describes the fabrication and use of nanostructures to study the physical properties of individual DNA molecules. In particular, there is a section of the thesis dealing with the electrical transport properties of individual DNA molecules in the dry state. Metal electrodes were fabricated spaced by 50 to 500 nm on silicon oxide. DNA molecules were deposited between these electrodes, and their electronic conductivity was measured using atomic force microscopy. In such thesis, the cooperative effect of at least 5 DNA strands connected in parallel was measured. It was concluded, under the chosen experimental conditions, that DNA was insulating at length scales larger than 40 nm.

As many experimental and theoretical studies, here reported, show, DNA conductance is an open debate. It is believed that DNA conductance can be strongly affected by both the spatial localization of the strand (whether it is straight or bended) and the cooperative effects exerted by the molecules.

In view of the above, the problem underlying the present invention is that of providing a device for the measurement of the electrical conductivity and quantum effects of individual molecules wherein the above cooperative effects can be isolated and wherein the difficulties and drawbacks of presently used such devices can be overcome.

SUMMARY OF THE INVENTION

The solution idea underlying the present invention is that of providing a nanometric device for the measurement of the electrical conductivity of individual molecules wherein suitably labeled molecules of interest can be individually inserted within nanometric trenches having electrically insulating walls and electrically conductive bases.

On the basis of this solution idea, the above stated problem has been solved by a nanometric device for the measurement of the electrical conductivity of individual molecules, as defined in claim 1.

The problem has also been solved by the methods which are defined in claims 8 and 16.

The characteristics and advantages of the device and methods according to the invention will be apparent from the following description of aspects thereof given by way of indicative and non limiting example with reference to the annexed drawings.

DETAILED DESCRIPTION

Figure 1:
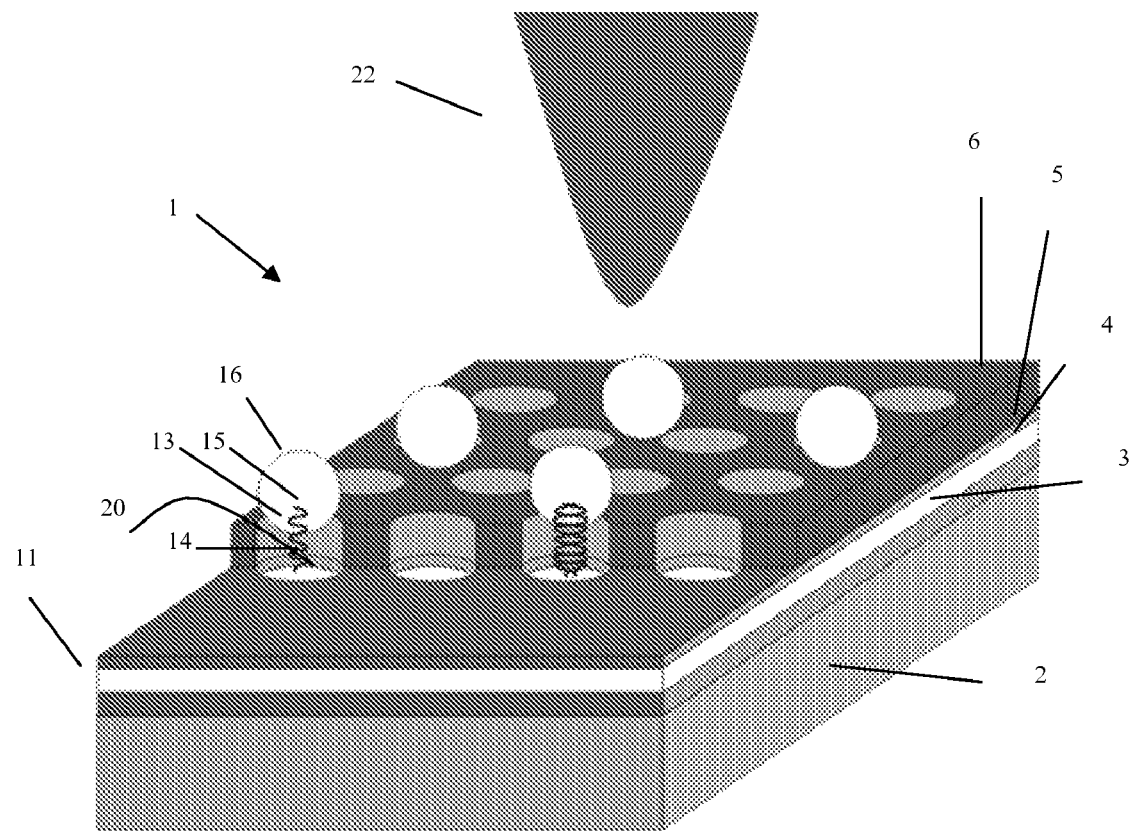
FIG. 1 shows a schematic of the device for single molecule conductive measurements according to the invention.
Figure 2:
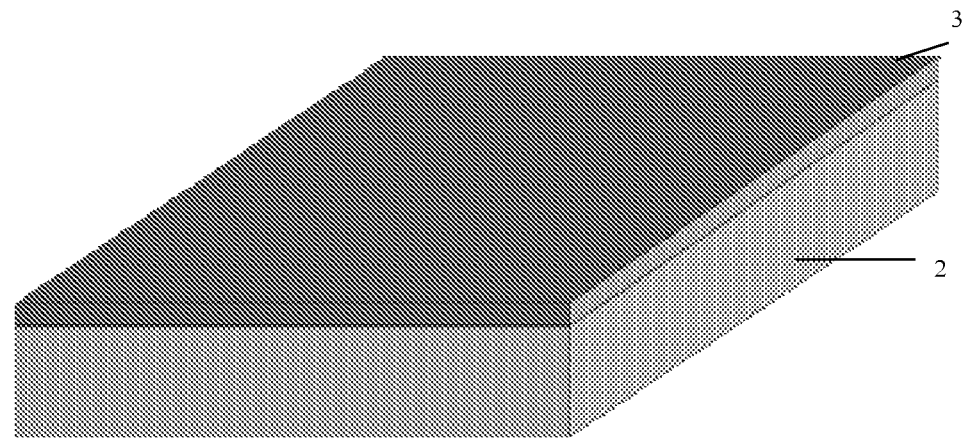
FIG. 2 shows the formation of a barrier to gold diffusion, according to the method of the invention.
Figure 3:
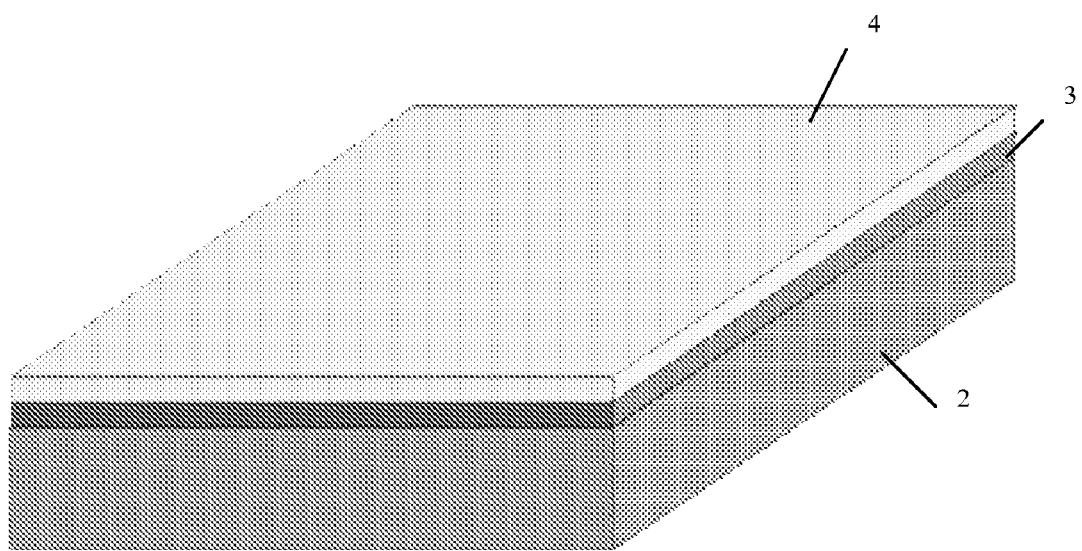
FIG. 3 shows the formation of a thin conductive gold layer, according to a preferred aspect of the method of the invention.
Figure 4:
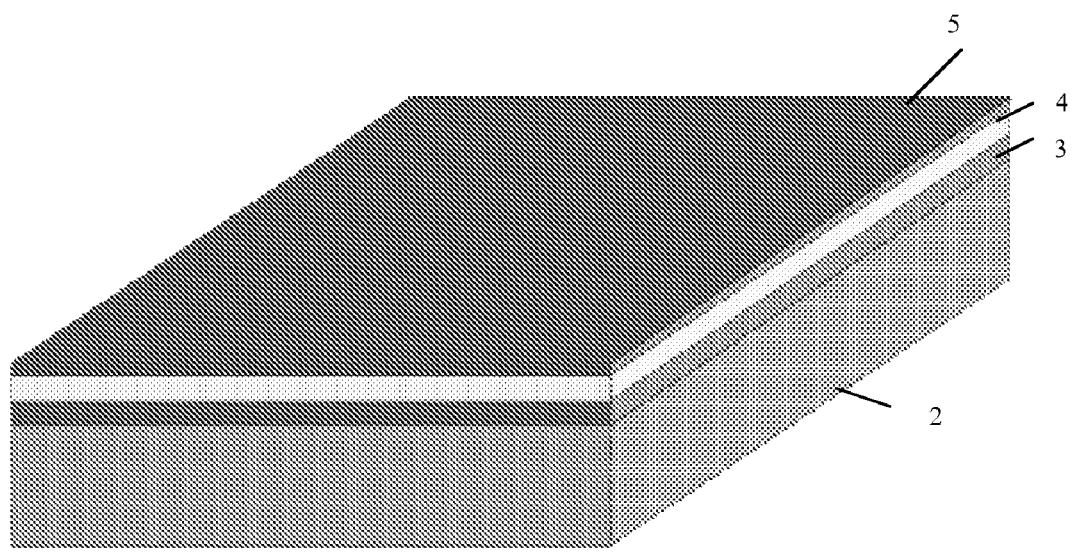
FIG. 4 shows the deposition of a "bounder" layer, according to the method of the invention.
Figure 5:
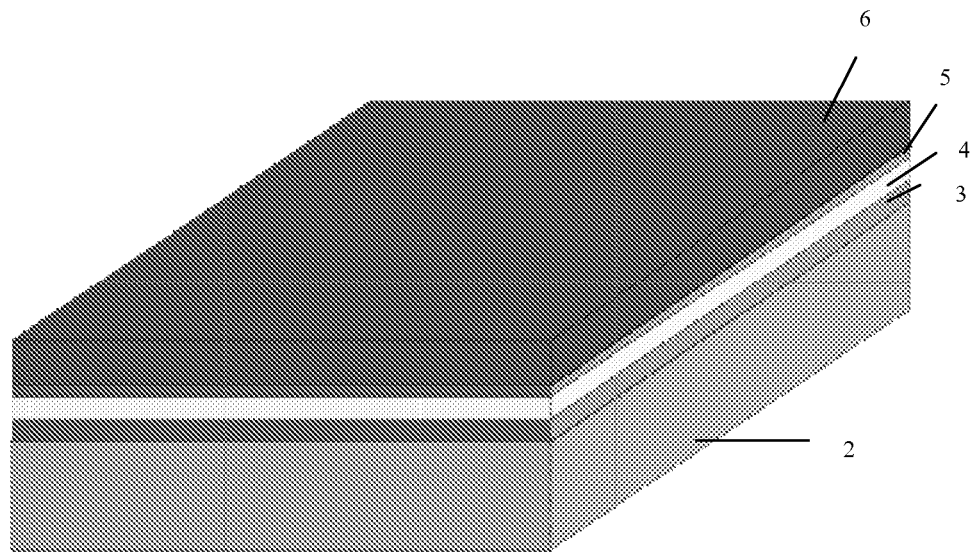
FIG. 5 shows the formation of an insulating $SiO_2$ layer, according to a preferred aspect of the method of the invention.
Figure 6:
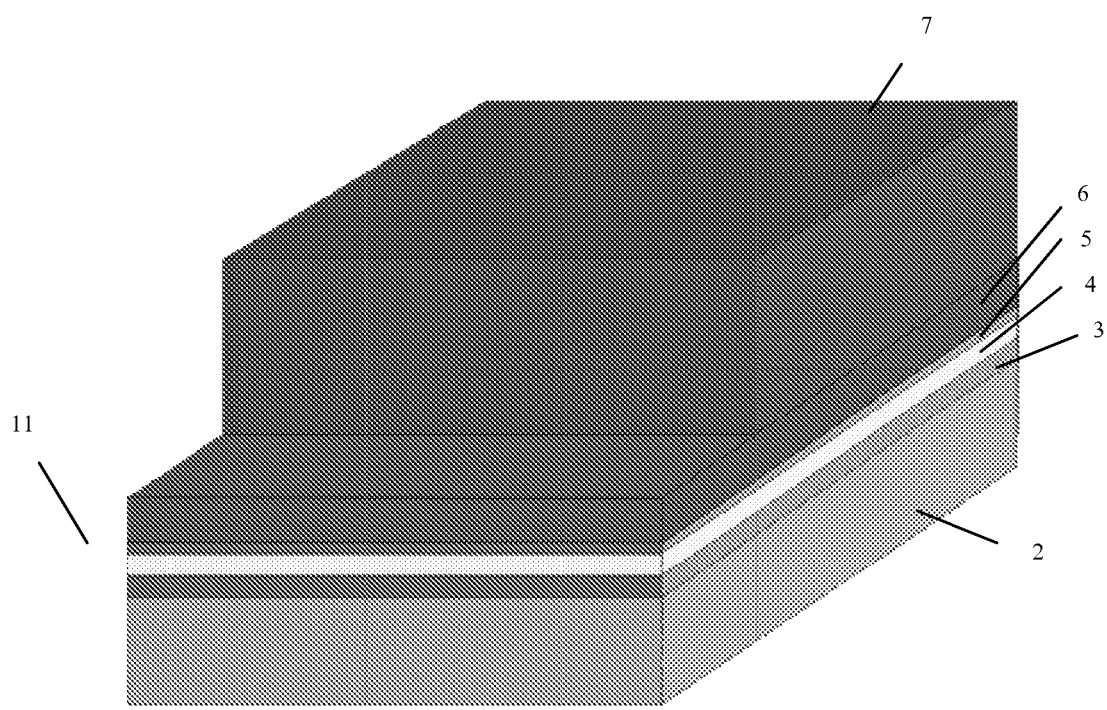
FIG. 6 shows the deposition of block copolymers, according to the method of the invention.
Figure 7:
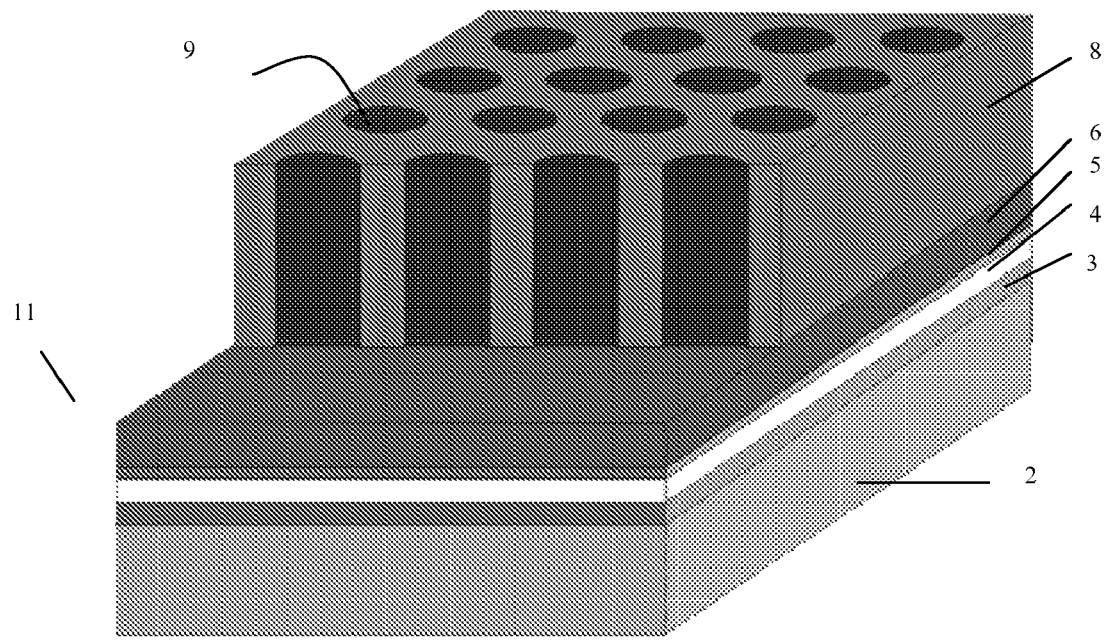
FIG. 7 shows the copolymer phase separation by thermal process, according to the method of the invention.
Figure 8:
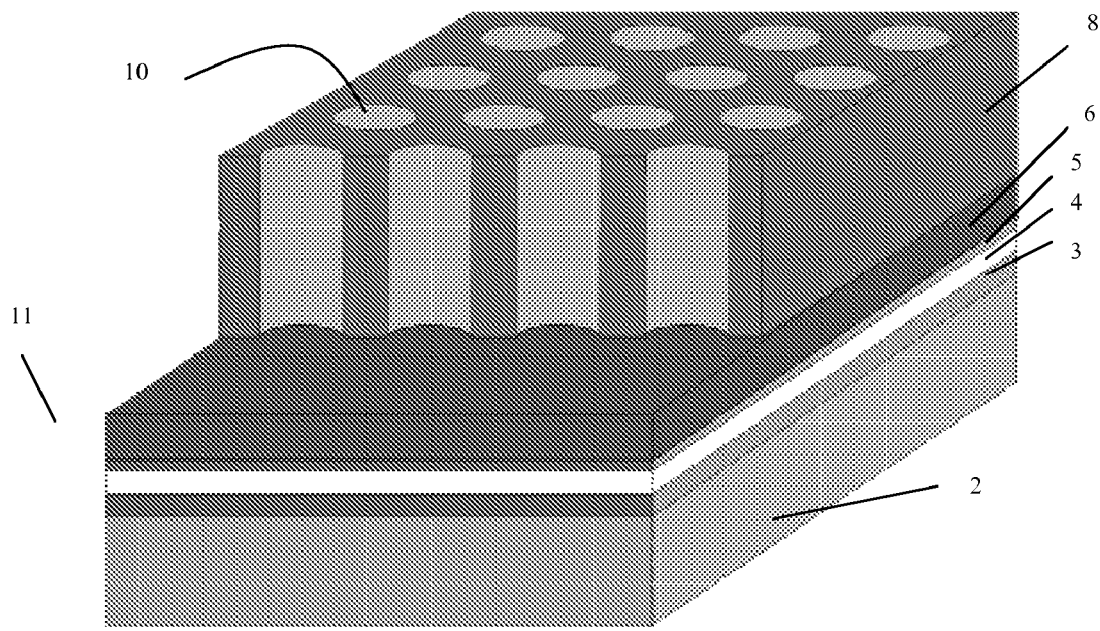
FIG. 8 shows the selective removal of one of the polymers, according to the method of the invention.
Figure 9:
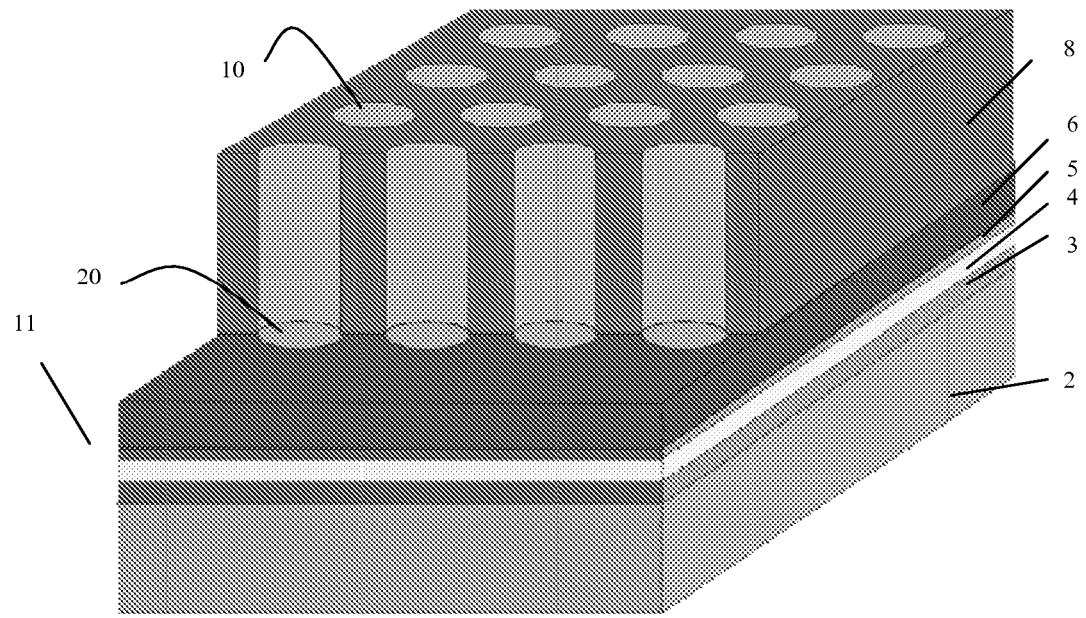
FIG. 9 shows the etching of the $SiO_2$ layer and of the "bounder" layer, according to a preferred aspect of the method of the invention.
Figure 10:
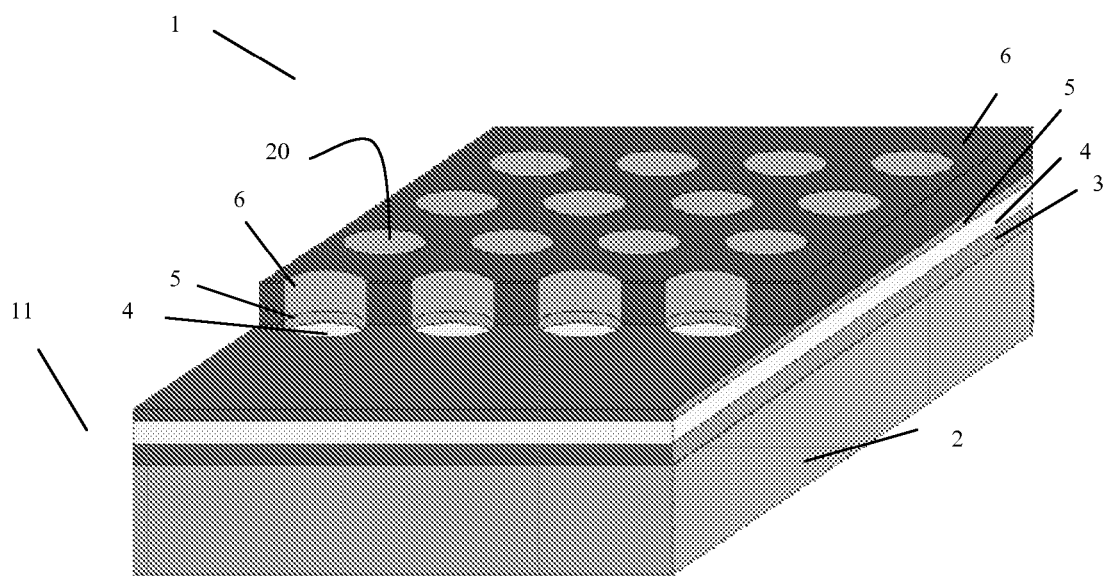
FIG. 10 shows the polymer mask removal, according to the method of the invention.

With reference to such figures, and in particular to FIG. 1, a preferred aspect of a device for the measurement of the electrical conductivity of individual molecules, indicated in its entirety by reference number 1, is disclosed.

The device for the measurement of the electrical conductivity of individual molecules and their quantum effect (hereon referred to as device) 1 consists of a substrate wafer 2, surmounted by, in order, a barrier to metal diffusion layer 3, an electrically conductive layer 4, a "bounder" layer 5 and an electrically insulating layer 6. The "bounder" layer 5 and the electrically insulating layer 6 exhibit a series of pores or trenches 20, the walls of which consist of the materials of layers 5 and 6 and the base of which consists of the electrically conductive layer 4.

The expression "bounder" layer is used throughout this document to mean a layer which serves the purpose of chemically bonding an electrically conductive layer with another which would otherwise peel off.

The barrier layer 3 may be made of Ti, TiW, TiN, Cr or combinations thereof, preferably a Ti/TiN/Ti alloy or Cr and serves the purpose of avoiding the diffusion of the material of the conductive layer 4 into the wafer substrate 2. The electrically conductive layer 4 may be made of Cu, Al or Au, preferably Au. The "bounder" (or primer) layer 5 is preferably made of Cr or Ti, and is between 1 and 3 nm in thickness. It serves the purpose of binding layers 4 and 6. The electrically insulating layer 6 may be made of $Si_3N_4$, $SiO_2$ or low k dielectric materials, preferably $SiO_2$. The thickness of layer 6 is dependent upon the length of a molecule 13 to be measured and is typically comprised between 3 nm and 50 nm.

The device also comprises a miniaturized probe 22, preferably an atomic force microscope (AFM) probe, or even more preferably a nanometric probe assembled in the device. The molecule 13 of interest is attached on one end 14 to the layer 4, and on the other end 15 to an electrically conductive nanoparticle 16. The electrical measurements are carried out by putting the electrically conductive nanoparticle 16 in physical and electrical contact with the probe 22.

FIGS. 2 to 10 are schematic representations of the steps of the method according to the invention for the manufacture of the device of the invention.

In particular, the method for the production of the device according to the invention comprises the steps of:

a) providing a wafer 2, preferably of Si;

b) forming a barrier layer 3, preferably a TiN/Ti/TiN alloy or Cr on the wafer 2;

c) forming a layer 4 of an electrically conductive material, preferably Au, on top of the barrier layer 3;

d) optionally patterning the electrically conductive layer 4;

e) forming a "bounder" layer (or primer) 5, preferably of Cr or Ti, on top of the electrically conductive layer 4;

f) forming an electrically insulating layer 6, preferably of $SiO_2$, on top of the "bounder" layer 5, the thickness of the electrically insulating layer 6 being a function of the length of a molecule 13 of interest to be measured;

g) forming a diblock copolymer layer 7 on top of the electrically insulating layer 6;

h) carrying out a thermal process, suitable to enable the diblock copolymer to auto-assembly and form cylindrical regions, constituted by one of the two polymers of the diblock copolymer, embedded in a matrix constituted by the other of the two polymers 8 and 9;

i) selectively removing one of the two polymers 8 and 9, so as to form an etch mask 8 in which a plurality of ordered trenches 10 are obtained;

j) performing an etching of the electrically insulating layer 6 and the "bounder" layer 5 through the trenches 10, thus forming corresponding pores 20 through the insulating and "bounder" layers 5 and 6;

k) removing the polymer etch mask 8

Preferably, the patterning of the electrically conductive layer 4 is carried out by means of reactive ion etching with $SF_6$ and chemically assisted ion etching in Cl/Ar atmosphere.

Preferably, the thickness of the insulating layer 6 is comprised between 3 nm and 50 nm.

Preferably, the thermal process consists of an annealing process performed at a temperature comprised between 150° C. and 210° C. for 1 to 3 hours in vacuum, preferably performed at 180° C. for 2 hours.

Preferably, the etching of the electrically insulating layer 6 is carried out by means of reactive ion etching with $CH_3$ and $CH_4$ in an Ar atmosphere.

Figure 11:
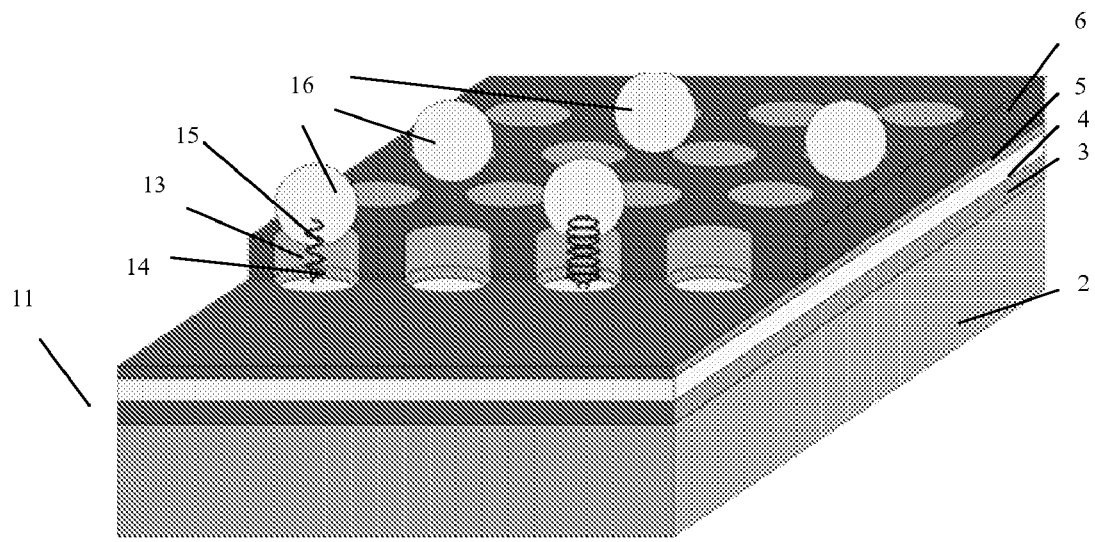
FIG. 11 shows the deposition of the functionalized molecules into the nanometric pores, according to the method of the invention.

With reference to FIG. 11, the present invention also encompasses a method for the measurement of the electrical conductivity (and quantum effects) of a molecule 13 of interest by means of the device 1 of the invention comprising the steps of:

a) providing a molecule 13 of interest;
b) labeling the molecule 13 of interest on one end 15 thereof with an electrically conductive nanoparticle 16 having a larger diameter than that of a respective nanometric pore 20;
c) functionalizing the molecule 13 of interest on an opposite end 14 thereof in such a way that the end 14 is anchorable to the electrically conductive base of the nanometric pore 20;
d) inserting the functionalized end 14 of the molecule 13 of interest in the pore 20 thus causing the molecule to bind to the conductive base and to remain in an extended configuration by virtue of its association with the electrically conductive nanoparticle 16;
e) activating a probe 22, preferably an AFM or a nanometric probe assembled in the device 1 for the detection of the electric conductivity of the functionalized molecule 13 of interest.

Advantageously, the molecule 13 of interest, for example a DNA molecule, is functionalized by the presence of an SH group at the 3' or the 5, end of the strand. To maintain the SH group, DNA can be immersed in a dithiothreitol (DTT) solution at room temperature for 30 minutes, centrifuged and subsequently immobilized for 10 to 14 h, preferably 12 h (over night), at room temperature on the gold surface.

Advantageously, the molecule 13 of interest is labeled by gold nanoparticles. DNA, for example, is reduced using mercaptoethylamine hydrochloride (MEA). The reduced DNA is isolated by gel filtration chromatography and conjugated with the gold nanoparticles for 12-18 hours at 4° C. for 1 to 3 hours, preferably 2 h, at room temperature. The unbound gold nanoparticles are separated from the DNA conjugated using gel filtration chromatography.

Figure 12:
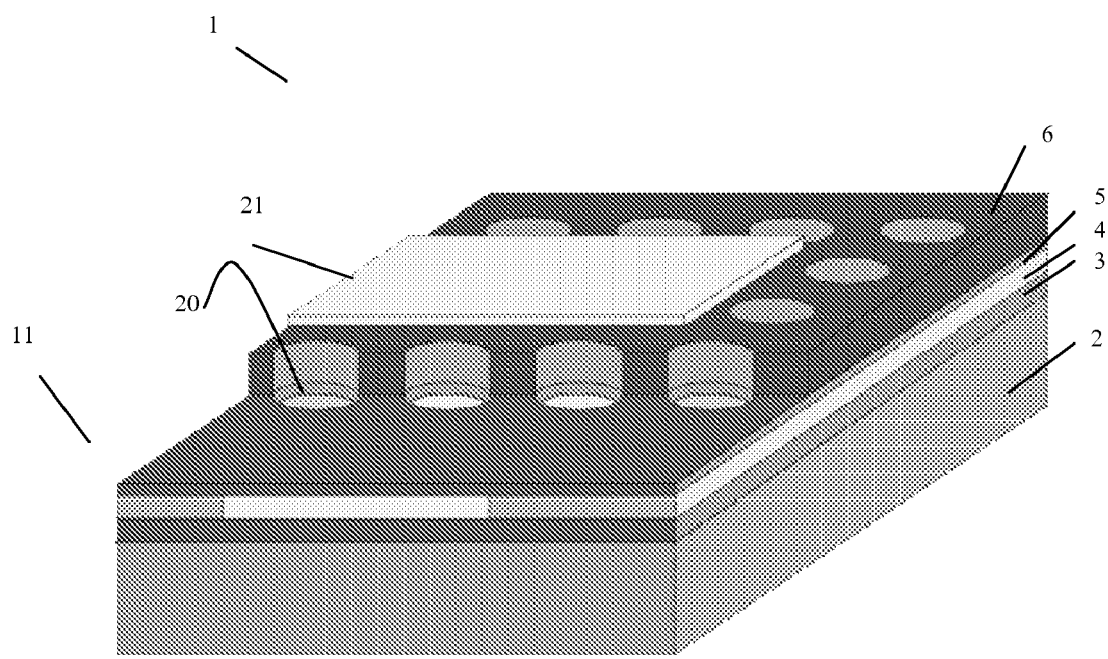
FIG. 12 shows the device including as few as four molecules for the measurement and use of quantum effects, according to a preferred aspect of the invention.

With reference to FIG. 12, such method may also include, prior to step d), the additional step of deposition of a further electrically conductive layer 21, preferably of Au, on top of at least one of the pores 20 and the patterning thereof.

The resulting device, which measures enhanced quantum effects, uses standard photolithography to pattern an electrically conductive layer on top of and beneath an electrically insulating layer. According to this aspect of the method of the invention, as few as four molecules may be connected in a single device 1. Preferably, such molecules have identical structural configurations.

EXAMPLE 1

In the following, a practical example of fabrication and use of the proposed device will be illustrated in detail.

A sequential deposition of TiN, Ti, and TiN was performed on top a silicon wafer substrate, in a Physical Vapor Deposition system. After the formation of such diffusion barrier layer, 20 nm of gold were deposited on top of the diffusion barrier layer formed, in a sputtering system. Sequentially, in the same sputtering system, a Cr layer of 5 nm was deposited. A 10 nm thick layer of $SiO_2$ was then deposited by sputtering on top of the Cr layer. A 30 nm thick film of diblock copolymers composed of polystyrene and polymethylmethacrylate, denoted P(S-b-MMA), having molecular weight of 67 kg/mol, was formed on top of the $SiO_2$ layer by spin coating, from a diluted solution of the polymers.

A thermal process in vacuum at 180° C. for 2 h was then performed. The wafer was exposed to a 254 nm UV radiation, and to etching in acetic acid. An array of circular pores of 20 nm in diameter, with center-center distances of about 40 nm, was then obtained. A reactive ion etching in $SF_6$ was performed to etch the $SiO_2$ through the pores, and to transfer the polymer pattern in the $SiO_2$. After etching, the polymer was removed. To etch the Cr, a chemically-assisted ion etching process based on a Cl/Ar chemistry, was performed.

A 30 basis long (ca. 10 nm in length) DNA strand was functionalized at the 3' end by the presence of an SH group. The 5' end was protected in this phase. To ensure the absence of an S—S group in the DNA chain, the chain was made to react with dithiothreitol (DTT) at room temperature for 30 minutes and finally recovered by centrifugation. The so treated DNA strand was then subjected to immobilization for 12 h at room temperature on the gold surface.

Labeling with gold nanoparticles, having diameter of 25 nm, was performed by reduction of the 5' end with mercaptoethylamine hydrochloride (MEA). The reduced DNA was isolated by gel filtration chromatography and conjugated with the gold nanoparticles for 3 hours at room temperature. The unbound gold nanoparticles were separated from the conjugated DNA using gel filtration chromatography. The DNA was then anchored to the gold on the bottom of the $SiO_2$ trenches Finally, AFM measurements were performed on the sample. It was found that the diameter of the gold nanoparticles prevented the anchoring of more than one DNA strand in the same $SiO_2$ hole, while the $SiO_2$ thickness, which was selected on the basis of the length of the DNA strand to be measured, ensured the desired spatial position of the strand.

Advantageously, the methods of the present invention allow the accommodation of a suitably functionalized single molecule of interest within a nanometric pore in such a way that it is suspended from the top of its respective pore and is free from any interaction, vicinity or disturbance from other molecules.

This result is obtained by virtue of the labeling and functionalizing of the molecule as well as the composition of the pore wall and base layers which enable the anchoring of the inserted molecule to the electrically conductive base of its respective pore.

It should be noted that, advantageously, the diameter of the pores may be adjusted according to requirements by suitably choosing specific molecular weight block copolymers. Typically the pore diameter varies between 15 nm and 50 nm.

A further improvement of the device fabrication is the patterning, through standard photolithography, of the gold layer 4 and the deposition of a thin gold stripe 21 (FIG. 12). In this aspect it is possible to electrically connect, by using standard measurement equipment, as few as four DNA strands in a single nanometric device. To fabricate this improved device, a 90 nm wide gold stripe is photolithographically defined on layer 4, and by etching the excess gold through a $HNO_3$:HCl (1:3) solution. The process is then made to proceed as described above. Finally, a 3 nm thin gold layer is deposited on the top of device 1, and a 90 nm wide gold stripe is again formed, as described above. In this case the stripe is perpendicular to the stripe of layer 4. In such a configuration a restricted number of about 4 DNA strands are connected in the nanometric device.

The present invention provides a solution to the not yet solved scientific problem of measuring the conductance of a single DNA molecule in its stranded configuration and electrically isolated from other DNA molecules. From the technical point of view, the present invention provides a method of fabrication and use of a device for the measurement of the electrical conductivity of individual molecules and their quantum effects which avoids the formation of cooperative effects between molecules or preferential electrical paths. The present invention thus overcomes the limits which still affect the approaches realized according to the prior art.

As well as the measurement of conductivity and quantum effect of molecules, the device of the invention finds application as the basic element to achieve molecular computing, DNA computing and/or DNA hybridization phenomena recognition.

In particular, DNA is attracting particular attention among organic molecules, in the industry, both for its use as a molecular wire (to be used as nanometric device or interconnect) and for the manufacturing of new diagnostic tools for genetic diseases, which exploit the principles of DNA hybridization.

The manufacturing technique of the device of the invention is compatible with very large scale integration (VLSI) technology and clean room processing. Moreover, the nanomask manufacturing process is simple, low cost, repeatable and compatible with standard semiconductor manufacturing processes.

The manufacturing technique of the device of the invention allows the skilled person to select pore diameter and distance between the pores according to parameters which are independent of the thickness of the layers involved.

The diameter of the gold nanoparticle prevents the anchoring of more than one DNA strand in the same $SiO_2$ trench, while the $SiO_2$ thickness, based on the length of the DNA strand, ensures that the desired spatial configuration of the strand is maintained all over the wafer.

In the device sketched in FIG. 12, it is possible to electrically connect as few as four DNA strands in a nanometric device, by using standard lithography for its fabrication and standard measurement equipment for its characterization.

The invention claimed is:

1. A nanometric device for the measurement of the electrical conductivity of individual molecules and their quantum effects consisting of:
    a substrate surmounted by, in order, a barrier to diffusion layer, an electrically conductive layer, a "bounder" layer and an electrically insulating layer; and
    a suitable miniaturized probe;
    wherein the "bounder" layer and the electrically insulating layer have at least one nanometric pore formed within, the base of which consists of the electrically conductive layer;
    each of the individual molecules is housed inside one nanometric pore and are attached on one end to the electrically conductive layer, and on the other end to an electrically conductive nanoparticle having a larger diameter than that of the corresponding nanometric pore;
    the miniaturized probe being put in physical and electrical contact with the electrically conductive nanoparticle for carrying out the measurement of the electrical conductivity of the individual molecules.

2. The nanometric device of claim 1, wherein the substrate is a silicon wafer.

3. The nanometric device of claim 1, wherein the barrier to diffusion layer is made of a material chosen from the group comprising Ti, TiW, TiN, Cr, and combinations thereof.

4. The nanometric device of claim 3, wherein the barrier to diffusion layer is made of a TiN/Ti/TiN alloy.

5. The nanometric device of claim 1, wherein the electrically conductive layer is made of a material chosen from the group comprising Au, Cu, Al, and combinations thereof.

6. The nanometric device of claim 5, wherein the electrically conductive layer is made of Au.

7. The nanometric device of claim 1, wherein the "bounder" layer is made of a material chosen from the group comprising Cr, Ti, and combinations thereof.

8. The nanometric device of claim 7, wherein the "bounder" layer is made of Cr.

9. The nanometric device of claim 1, wherein the electrically insulating layer is made of a material chosen from the group comprising $SiO_2$, $Si_3N_4$, low k dielectric materials, and combinations thereof.

10. The nanometric device of claim 9, wherein the electrically insulating layer is made of $SiO_2$.

11. The nanometric device of claim 1, wherein the miniaturized probe is an atomic force microscope probe assembled in the device.

12. The nanometric device of claim 1, wherein the electrically conductive nanoparticle is gold.

13. The nanometric device of claim 1, wherein the thickness of the electrically insulating layer, defining the depth of the nanometric pores, is comprised between 3 nm and 50 nm.

14. The nanometric device of claim 1, wherein the diameter of the nanometric pores is comprised between 15 nm and 50 nm.

15. The nanometric device of claim 1, wherein the miniaturized probe is a nanometric probe assembled in the device.

16. The nanometric device of claim 1, wherein the individual molecules are DNA molecules.

17. The nanometric device of claim 16, wherein the DNA molecules are functionalized by the presence of SH groups.

* * * * *